US012046454B2

(12) United States Patent
Sawachi et al.

(10) Patent No.: US 12,046,454 B2
(45) Date of Patent: Jul. 23, 2024

(54) PERFORMANCE CALCULATION METHOD AND PROCESSING APPARATUS

(71) Applicant: TOKYO ELECTRON LIMITED, Tokyo (JP)

(72) Inventors: Atsushi Sawachi, Miyagi (JP); Norihiko Amikura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 966 days.

(21) Appl. No.: 16/922,579

(22) Filed: Jul. 7, 2020

(65) Prior Publication Data

US 2021/0013012 A1   Jan. 14, 2021

(30) Foreign Application Priority Data

Jul. 10, 2019   (JP) .................................. 2019-128718

(51) Int. Cl.
| | |
|---|---|
| *H01J 37/32* | (2006.01) |
| *C23C 16/455* | (2006.01) |
| *C23C 16/52* | (2006.01) |
| *G01F 1/696* | (2006.01) |
| *G05B 23/02* | (2006.01) |
| *H01L 21/67* | (2006.01) |

(52) U.S. Cl.
CPC .. *H01J 37/32449* (2013.01); *C23C 16/45523* (2013.01); *C23C 16/52* (2013.01); *G01F 1/696* (2013.01); *G05B 23/02* (2013.01); *G05B 23/0205* (2013.01); *H01L 21/67069* (2013.01); *H01L 21/67253* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 9,236,230 B2 | 1/2016 | Kato et al. | |
| 2008/0103788 A1* | 5/2008 | Morris | G06Q 10/04 |
| | | | 705/306 |

(Continued)

FOREIGN PATENT DOCUMENTS

JP   2012-248788 A   12/2012

OTHER PUBLICATIONS

Duffy, Daniel F. Thermal mass flow measurement. Diss. Dublin City University, 2000. (Year: 2000).*

(Continued)

*Primary Examiner* — Carlos R Ortiz Rodriguez
(74) *Attorney, Agent, or Firm* — XSENSUS LLP

(57) ABSTRACT

A performance calculation method is provided. In the performance calculation method, shipment inspection data of multiple flow rate controllers are acquired. Further, first performance values indicating, as deviation values, performance of the flow rate controllers are calculated based on the acquired shipment inspection data and first coefficients for items indicating the performance of the flow rate controllers. Further, second performance values indicating, as deviation values, performance of a processing apparatus using the flow rate controllers are calculated based on the calculated first performance values and second coefficients for items indicating the performance of the processing apparatus.

14 Claims, 14 Drawing Sheets

(56) References Cited

U.S. PATENT DOCUMENTS

2014/0039764 A1* 2/2014 Aso .................. G06F 17/00
701/45
2018/0101924 A1* 4/2018 Yamaguchi ............ G06N 20/00

OTHER PUBLICATIONS

Zantek, Paul F., Gordon P. Wright, and Robert D. Plante. "Process and product improvement in manufacturing systems with correlated stages." Management Science 48.5 (2002): 591-606. (Year: 2002).*

Savadkouhi, J. "Reliability considerations for gas delivery components." Advanced Semiconductor Manufacturing Conference and Workshop, 2003 IEEEI/SEMI. IEEE, 2003. (Year: 2003).*

Couturier, Pierre. "Optimising the Control Parameters in a Digital Mass Flow Controller." IFAC Proceedings vols. 39.3 (2006): 167-172. (Year: 2006).*

Vichare, Nikhil M., and Michael G. Pecht. "Prognostics and health management of electronics." IEEE transactions on components and packaging technologies 29.1 (2006): 222-229. (Year: 2006).*

Parlikad, Ajith Kumar, and Duncan McFarlane. "RFID-based product information in end-of-life decision making." Control engineering practice 15.11 (2007): 1348-1363. (Year: 2007).*

Ondemir, Onder, Mehmet Ali Ilgin, and Surendra M. Gupta. "Optimal end-of-life management in closed-loop supply chains using RFID and sensors." IEEE Transactions on Industrial Informatics 8.3 (2011): 719-728. (Year: 2011).*

Ilie-Zudor, Elisabeth, et al. "A survey of applications and requirements of unique identification systems and RFID techniques." Computers in Industry 62.3 (2011): 227-252. (Year: 2011).*

Yayinu, Rahel. "Product quality control in Lean organization: Case: Work method standardization." (2016). (Year: 2016).*

* cited by examiner

FIG.4

| ADJUSTMENT/ INSPECTION ITEMS | OUTPUT VALUES | MAXIMUM/MINIMUM VALUES AT THE TIME OF SHIPPING | SHIPMENT INSPECTION ITEM DEVIATION VALUES | | |
|---|---|---|---|---|---|
| TEMPERATURE DIFFERENCE | TEMP.(T) VS PRESSURE(P OUTPUT) | dP/dT(min) — dP/dT(max) | a1 | a2 | a3 |
| PRESSURE DIFFERENCE | INITIAL P1/P2 OUTPUT | P(min) — P(max) | b1 | b2 | b3 |
| CONTROL VALVE ADJUSTMENT | CONTROL VALVE OUTPUT | Θ(min) — Θ(max) | c1 | c2 | c3 |
| ZERO POINT ALARM | ZERO POINT VALUE | P0(min) — P0(max) | d1 | d2 | d3 |
| EXTERNAL LEAKAGE CHECK | LEAKAGE DETECTOR OUTPUT VALUE | dp/dt(min) — dp/dt(max) | e1 | e2 | e3 |
| INTERNAL LEAKAGE CHECK | LEAKAGE DETECTOR OUTPUT VALUE | dp/dt(min) — dp/dt(max) | f1 | f2 | f3 |
| FLOW RATE CORRECTION/INSPECTION | FLOW RATE ACCURACY VALUE | $-\alpha\%S.P$ — $+\alpha\%S.P$ | g1 | g2 | g3 |

FIG.5

| ADJUSTMENT/ INSPECTION ITEMS | OUTPUT VALUES | | INDIVIDUAL PERFORMANCE ITEMS | | | | |
|---|---|---|---|---|---|---|---|
| | | | 1 FLOW RATE ACCURACY (ABSOLUTE FLOW RATE) | 2 RESPONSIVENESS (VARIATION) | 3 CONTROLLABILITY (RESISTANCE TO EXTERNAL FACTORS) | 4 DURABILITY (HARDWARE) | 5 AGING (SENSOR) |
| TEMPERATURE DIFFERENCE | TEMP. (T) VS PRESSURE(P OUTPUT) | α | ● | | | | ● |
| PRESSURE DIFFERENCE | INITIAL P1/P2 OUTPUT | β | ● | ● | | | ● |
| CONTROL VALVE ADJUSTMENT | CONTROL VALVE OUTPUT | γ | | ● | ● | ● | |
| ZERO POINT ALARM | ZERO POINT VALUE | δ | ● | ● | | | ● |
| EXTERNAL LEAKAGE CHECK | LEAKAGE DETECTOR OUTPUT VALUE | ε | | ● | | ● | |
| INTERNAL LEAKAGE CHECK | LEAKAGE DETECTOR OUTPUT VALUE | ζ | | | | ● | |
| FLOW RATE CORRECTION/ INSPECTION | FLOW RATE ACCURACY VALUE | η | ● | | | | |

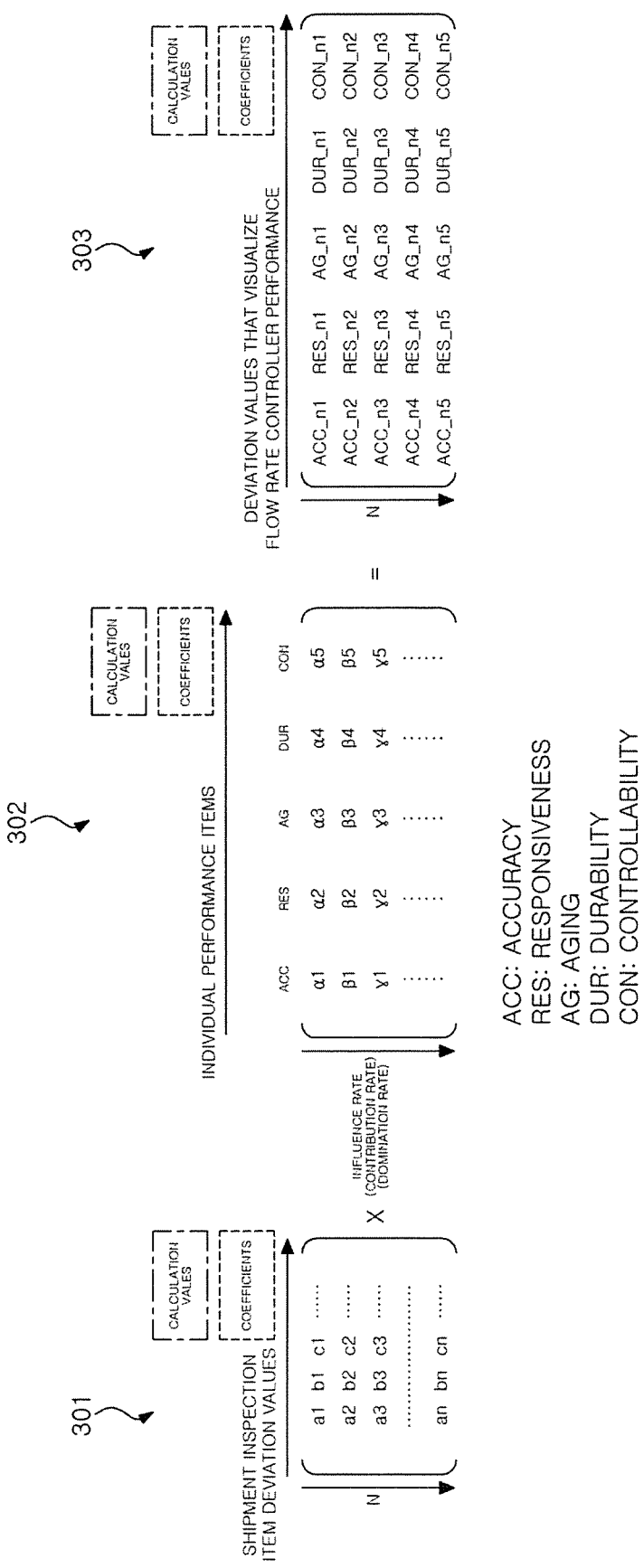

MODEL: RESPONSIVENESS (VARIATION)

*FIG.9*

| APPARATUS PERFORMANCE ITEMS | CORRESPONDING FUNCTION | MEASUREMENT METHOD | ITEM No. | INFLUENCE RATE (INDIVIDUAL PERFORMANCE ITEMS) | | | | |
|---|---|---|---|---|---|---|---|---|
| | | | | v FLOW RATE ACCURACY (ABSOLUTE FLOW RATE) | w RESPONSIVENESS (VARIATION) | x CONTROLLABILITY (RESISTANCE TO EXTERNAL FACTORS) | y DURABILITY (HARDWARE) | z AGING (SENSOR) |
| FLOW RATE CORRECTION | AUTOMATIC CORRECTION | Q(P1, P2), TEMP. T | 1 | ● | | | | ● |
| FLOW RATE PRE-CONTROL SEQUENCE | AUTOMATIC CORRECTION | P1, P2 CONTROL VALVE OUTPUT | 2 | | ● | | | |
| HUNTING PREVENTION SEQUENCE | AUTOMATIC CORRECTION | P1, P2 CONTROL VALVE OUTPUT | 3 | | ● | | | |
| STABLE FLOW RATE CHECK | ALARM | Q(P1, P2), TEMP.T, dP/dt | 4 | ● | | | | ● |
| TRANSIENT RESPONSE FLOW RATE CHECK | ALARM | Q(P1, P2), TEMP.T, dP/dt | 5 | ● | ● | ● | | ● |
| HEALTH CHECK | ALARM | Q(P1, P2) | 6 | ● | ● | | ● | |

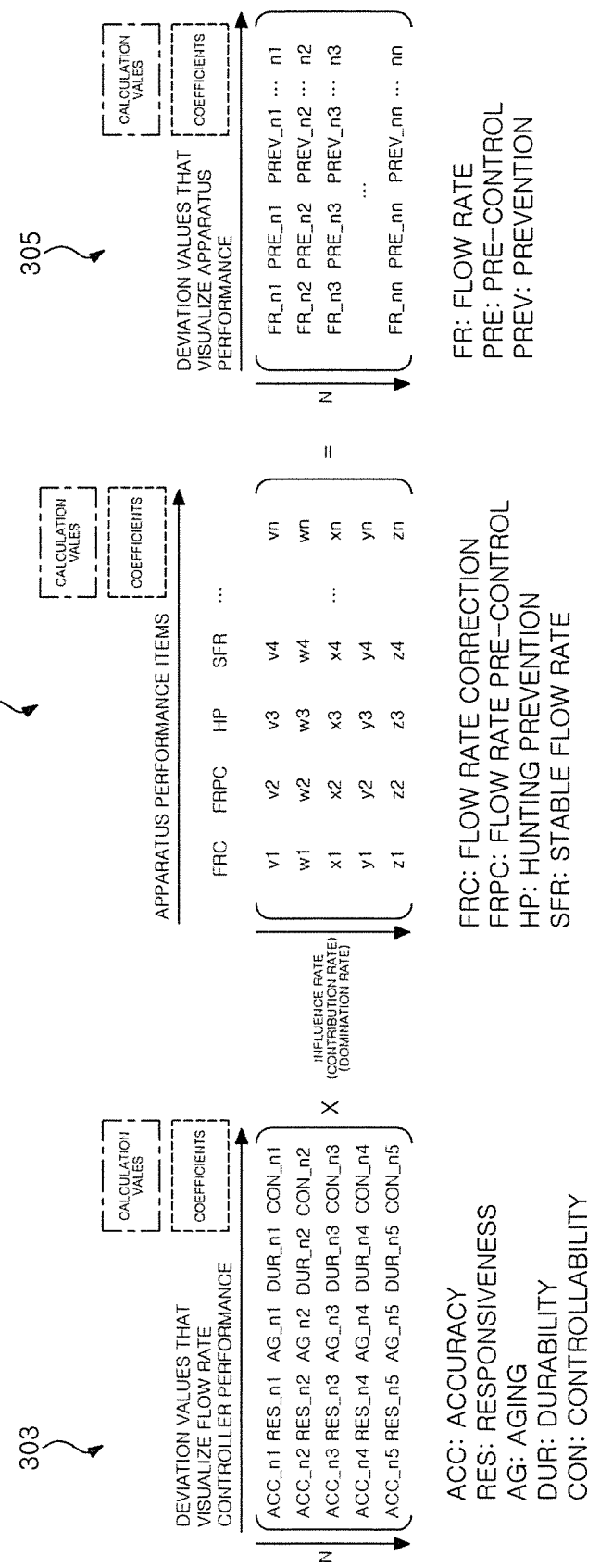

PERFORMANCE CALCULATION METHOD AND PROCESSING APPARATUS

CROSS-REFERENCE TO RELATED APPLICATIONS

This application claims priority to Japanese Patent Application No. 2019-128718, filed on Jul. 10, 2019, the entire contents of which are incorporated herein by reference.

TECHNICAL FIELD

The present disclosure relates to a performance calculation method and a processing apparatus.

BACKGROUND

A plasma processing apparatus performs processing such as film formation, etching, or the like on a target substrate by supplying a plurality of processing gases into a processing chamber. In such a plasma processing apparatus, a flow rate controller such as a mass flow controller (hereinafter referred to as "MFC") or the like is used to control flow rates of the processing gases (see, e.g., Japanese Patent Application Publication No. 2012-248788).

The present disclosure provides a performance calculation method capable of calculating the performance of a processing apparatus related to a flow rate controller, and the processing apparatus.

SUMMARY

In accordance with an aspect of the present disclosure, there is provided a performance calculation method including: acquiring shipment inspection data of multiple flow rate controllers; calculating first performance values indicating, as deviation values, performance of the flow rate controllers based on the acquired shipment inspection data and first coefficients for items indicating the performance of the flow rate controllers; and calculating second performance values indicating, as deviation values, performance of a processing apparatus using the flow rate controllers based on the calculated first performance values and second coefficients for items indicating the performance of the processing apparatus.

BRIEF DESCRIPTION OF THE DRAWINGS

The objects and features of the present disclosure will become apparent from the following description of embodiments, given in conjunction with the accompanying drawings, in which:

FIG. 4 shows an example of shipment inspection data of the flow rate controller according to the embodiment;

FIG. 5 shows examples of performance items of the flow rate controller according to the embodiment;

FIG. 6 shows an example of visualization of the performance of the flow rate controller according to the embodiment;

FIG. 9 shows examples of performance items of the plasma processing apparatus according to the embodiment;

FIG. 10 shows an example of visualization of performance of the plasma processing apparatus according to the embodiment;

DETAILED DESCRIPTION

Hereinafter, embodiments of a performance calculation method and a processing apparatus of the present disclosure will be described in detail with reference to the accompanying drawings. The following embodiments are not intended to restrict the present disclosure.

A mass flow controller (MFC) is an example of a flow rate controller, and the performance such as a flow rate accuracy of a processing gas or responsiveness generally varies between the mass flow controllers although each mass flow controller meet the standards. Therefore, it is difficult to detect an influence rate of the variation of the performance of the MFC on the performance of the plasma processing apparatus after the MFC is installed at the plasma processing apparatus. Therefore, it is desired to calculate the performance of the plasma processing apparatus related to the MFC and also desired to predict and correct the deterioration due to the aging of the MFC.

<Configuration of Plasma Processing Apparatus 100>

Figure 1:
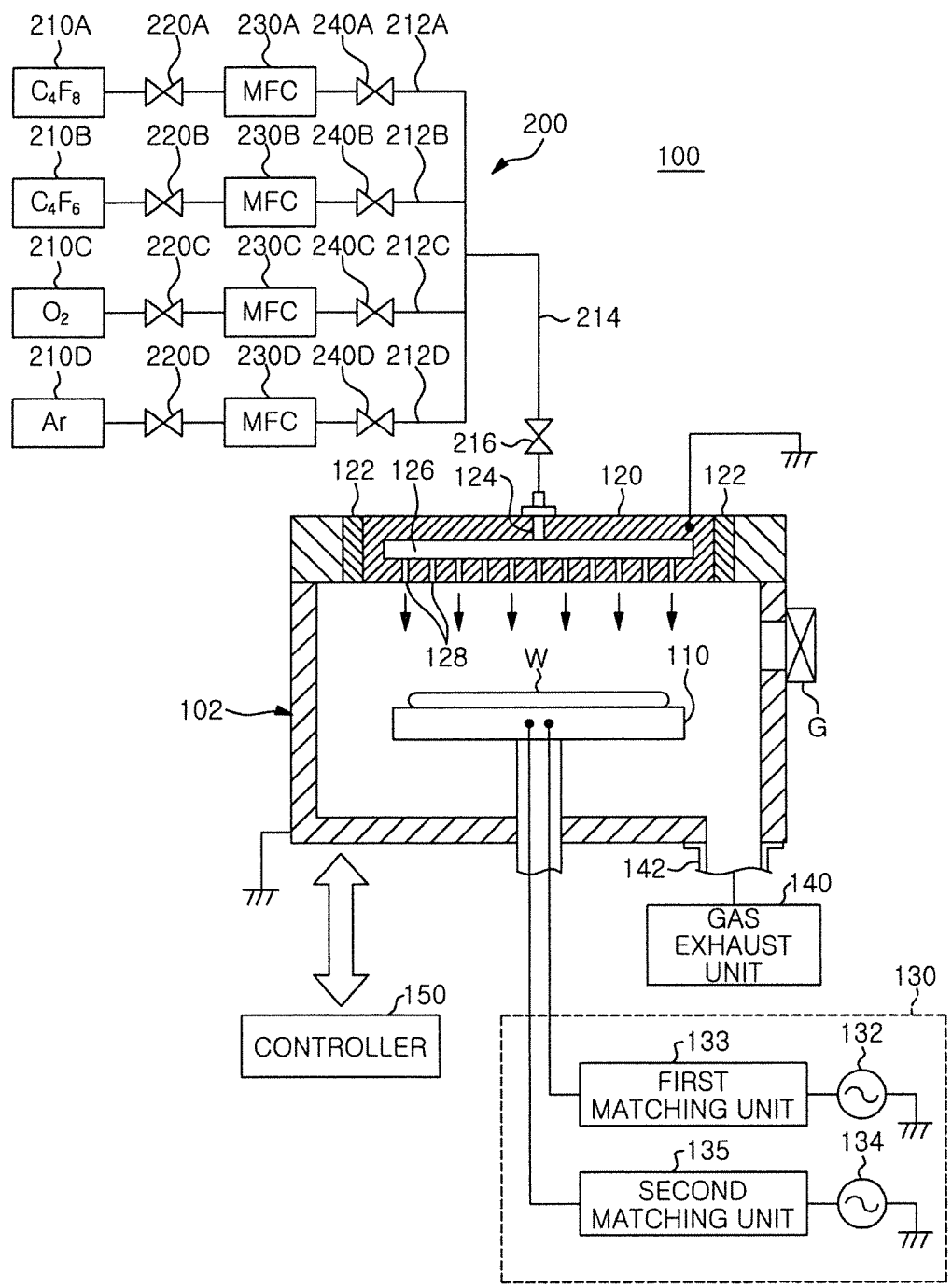
FIG. 1 shows an example of a plasma processing apparatus according to an embodiment of the present disclosure.

FIG. 1 shows an example of a plasma processing apparatus according to an embodiment of the present disclosure. A plasma processing apparatus 100 shown in FIG. 1 is an example of a parallel plate type plasma processing apparatus in which an upper electrode and a lower electrode (susceptor) are disposed to face each other in a processing chamber and a processing gas is supplied from the upper electrode into the processing chamber.

The plasma processing apparatus 100 includes a processing chamber 102 made of, e.g., a conductive material such as aluminum or the like, and a gas supply system 200 for supplying multiple types of gases into the processing chamber 102. The processing chamber 102 is electrically grounded. A lower electrode 110 (susceptor) serving as a substrate support on which a target substrate, e.g., a semiconductor wafer (hereinafter, simply referred to as "wafer") W is placed and an upper electrode 120 disposed to be opposite to the lower electrode 110 in parallel therewith are disposed in the processing chamber 102.

The lower electrode 110 is connected to a power supply device 130 for supplying a dual frequency superimposed power. The power supply device 130 includes a first radio frequency power supply 132 for supplying a first radio frequency power (for plasma generation) having a first frequency, and a second radio frequency power supply 134 for supplying a second radio frequency power (for bias voltage generation) having a second frequency lower than the first frequency. The first radio frequency power supply 132 and the second radio frequency power supply 134 are electrically connected to the lower electrode 110 through a first matching unit 133 and a second matching unit 135, respectively.

The first matching unit 133 and the second matching unit 135 are configured to match a load impedance with internal (or output) impedances of the first radio frequency power supply 132 and the second radio frequency power supply 134, respectively. The first matching unit 133 and the second matching unit 135 function such that the load impedance and the internal impedances of the first radio frequency power supply 132 and the second radio frequency power supply 134 apparently match when plasma is generated in the processing chamber 102.

The first radio frequency power supply 132 outputs a radio frequency power having a frequency of 27 MHz or higher (e.g., 40 MHz). The second radio frequency power supply 134 outputs a radio frequency power having a frequency of 13.56 MHz or less (e.g., 2 MHz).

The upper electrode 120 is attached to a ceiling portion of the processing chamber 102 through a shield ring 122 that surrounds a periphery of the upper electrode 120. The upper electrode 120 may be electrically grounded as shown in FIG. 1, or a predetermined DC voltage may be applied to the upper electrode 120 from a variable DC power supply (not shown) connected thereto.

A gas inlet port 124 for introducing a gas from the gas supply system 200 is formed at the upper electrode 120. Further, a diffusion space 126 for diffusing the gas introduced from the gas inlet port 124 is formed in the upper electrode 120.

The upper electrode 120 has a plurality of gas injection holes 128 for injecting the gas from the diffusion space 126 into the processing chamber 102. The gas injection holes 128 are formed to supply the gas to a space between the wafer W placed on the lower electrode 110 and the upper electrode 120.

Due to the presence of the upper electrode 120, the gas from the gas supply system 200 is supplied to the diffusion space 126 through the gas inlet port 124 and then distributed to the gas injection holes 128. Then, the gas is injected from the gas injection holes 128 toward the lower electrode 110. A specific configuration example of the gas supply system 200 will be described later.

A gas exhaust port 142 is formed at a bottom surface of the processing chamber 102. By exhausting the processing chamber 102 using a gas exhaust unit 140 connected to the gas exhaust port 142, a pressure in the processing chamber 102 can be maintained at a predetermined vacuum level. A gate valve G is disposed on a sidewall of the processing chamber 102. By opening the gate valve G, the wafer W can be loaded into and unloaded from the processing chamber 102.

The plasma processing apparatus 100 includes a controller 150 for controlling an overall operation of the plasma processing apparatus 100. The controller 150 is connected to a keyboard through which an operator inputs commands to manage the plasma processing apparatus 100, a display for visualizing and displaying an operation status of the plasma processing apparatus 100, or the like.

Further, the controller 150 includes a storage unit that stores a program for realizing various processes executed by the plasma processing device 100 under the control of the controller 150, processing conditions (recipe) required to execute the program, and the like. The processing conditions include a plurality of parameter values such as control parameters for controlling the respective components of the plasma processing apparatus 100, setting parameters, and the like. For example, the processing conditions may include parameter values such as flow rate ratios of processing gases (flow rates set for the MFCs), a pressure in the processing chamber, a radio frequency power, and the like.

These programs and processing conditions may be stored in a hard disk or a semiconductor memory, or may be stored in a portable computer-readable storage medium such as a compact disc read only memory (CD-ROM), a digital versatile disc (DVD), or the like.

The controller 150 executes a desired process in the plasma processing apparatus 100 by reading out a desired program and desired processing conditions from the storage unit and controlling the respective components based on an operator's instruction or the like. Further, the processing conditions can be modified by an operator's manipulation.

<Configuration of the Gas Supply System 200>

Here, a specific configuration example of the gas supply system 200 will be described. The gas supply system 200 is configured to selectively supply four types of processing gases ($C_4F_8$ gas, $C_4F_6$ gas, $O_2$ gas, Ar gas) into the processing chamber 102. Among these gases, $C_4F_8$ gas and $C_4F_6$ gas are alternately supplied as etching gases, and $O_2$ gas and Ar gas are supplied together with $C_4F_8$ gas and $C_4F_6$ gas, if necessary.

Specifically, the gas supply system 200 includes a $C_4F_8$ gas supply sources 210A, a $C_4F_6$ gas supply source 210B, an $O_2$ gas supply source 210C, and an Ar gas supply source 210D. The gas supply sources 210A to 210D join a common gas supply line (pipe) 214 through the gas supply lines (pipes) 212A to 212D, respectively. An opening/closing valve 216 is disposed in the common gas supply line 214. A downstream side of the common gas supply line 214 is connected to the upper electrode 120. The common gas supply line 214 may be provided with a filter for removing particles from the gas flowing therethrough.

Mass flow controllers (MFC) 230A to 230D that are examples of flow rate controllers for controlling flow rates of gases are disposed in the gas supply lines 212A to 212D, respectively. Upstream side opening/closing valves (first opening/closing valves) 220A to 220D and downstream side opening/closing valves (second opening/closing valves) 240A to 240D are disposed at upstream sides and downstream sides of the MFCs 230A to 230D, respectively.

Figure 2:
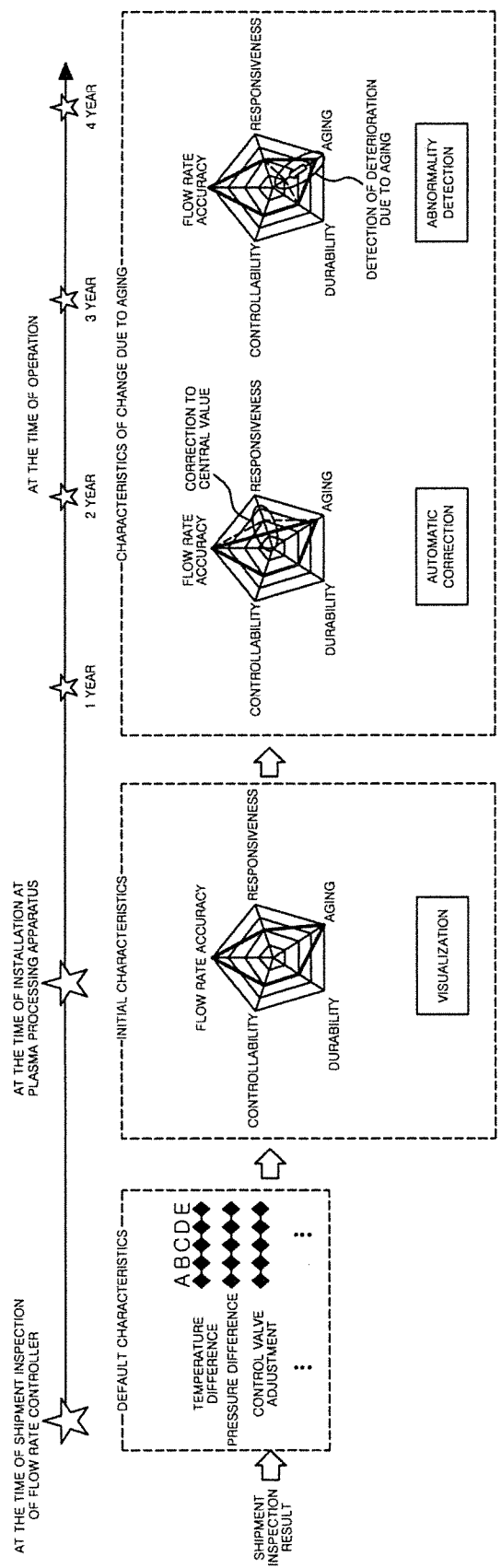
FIG. 2 shows an example of change due to aging in performance of a flow rate controller.

Here, the change due to aging in the performance of the MFC of the present embodiment will be described with reference to FIG. 2. In the following description, the MFCs 230A to 230D will be collectively referred to as "flow rate controller." FIG. 2 shows an example of the change due to aging in the performance of the flow rate controller. As shown in FIG. 2, various performance items are inspected as default characteristics during a shipment inspection of the flow rate controller. Next, the initial characteristics of the performance at the time of installation of the flow rate controller at the plasma processing apparatus 100 are visualized using deviation values. Then, as the plasma processing apparatus 100 operates, the change due to aging in the performance occurs, so that the deteriorated responsiveness, for example, is automatically corrected to the central value. If it is not possible to correct the deteriorated responsiveness, abnormality is detected and notified to an operator of the plasma processing apparatus 100 before the plasma processing apparatus 100 operates abnormally. As described above, in the present embodiment, the performance of the plasma processing apparatus 100 related to the flow rate controller (MFC) can be calculated, and the deterioration due to the aging of the flow rate controller (MFC) can be predicted or corrected.

Next, a specific example of wafer processing of the plasma processing apparatus 100 will be described. For example, in the present embodiment, plasma etching is performed to form a trench or a hole having a predetermined aspect ratio on an oxide film (e.g., silicon oxide film) formed on the wafer W while using a patterned predetermined film (e.g., resist film or polysilicon film) as a mask.

In this plasma etching, different types of processing gases are alternately switched in a short period of time in a state where plasma is generated during the plasma etching. Accordingly, it is possible to alternately repeat a first step using a processing gas having a strong deposition property (e.g., $C_4F_6$ gas) and a second step using a processing gas having a weak deposition property (e.g., $C_4F_8$ gas) in a state where plasma is generated.

Therefore, the etching can be performed while preventing a hole diameter or a trench width from being excessively increased. Accordingly, it is possible to form a trench or a hole having a higher aspect ratio and a larger depth on the surface of the wafer W. Further, for example, by setting both gases to be switched as gases used for plasma etching such as $C_4F_6$ gas and $C_4F_8$ gas, plasma can be continuously generated by continuously applying the radio frequency power during the plasma etching without having to turn the plasma on or off depending on the type of processing gas whenever the processing gas is switched. Therefore, the throughput can be further improved.

<Configuration of Controller 150>

Figure 3:
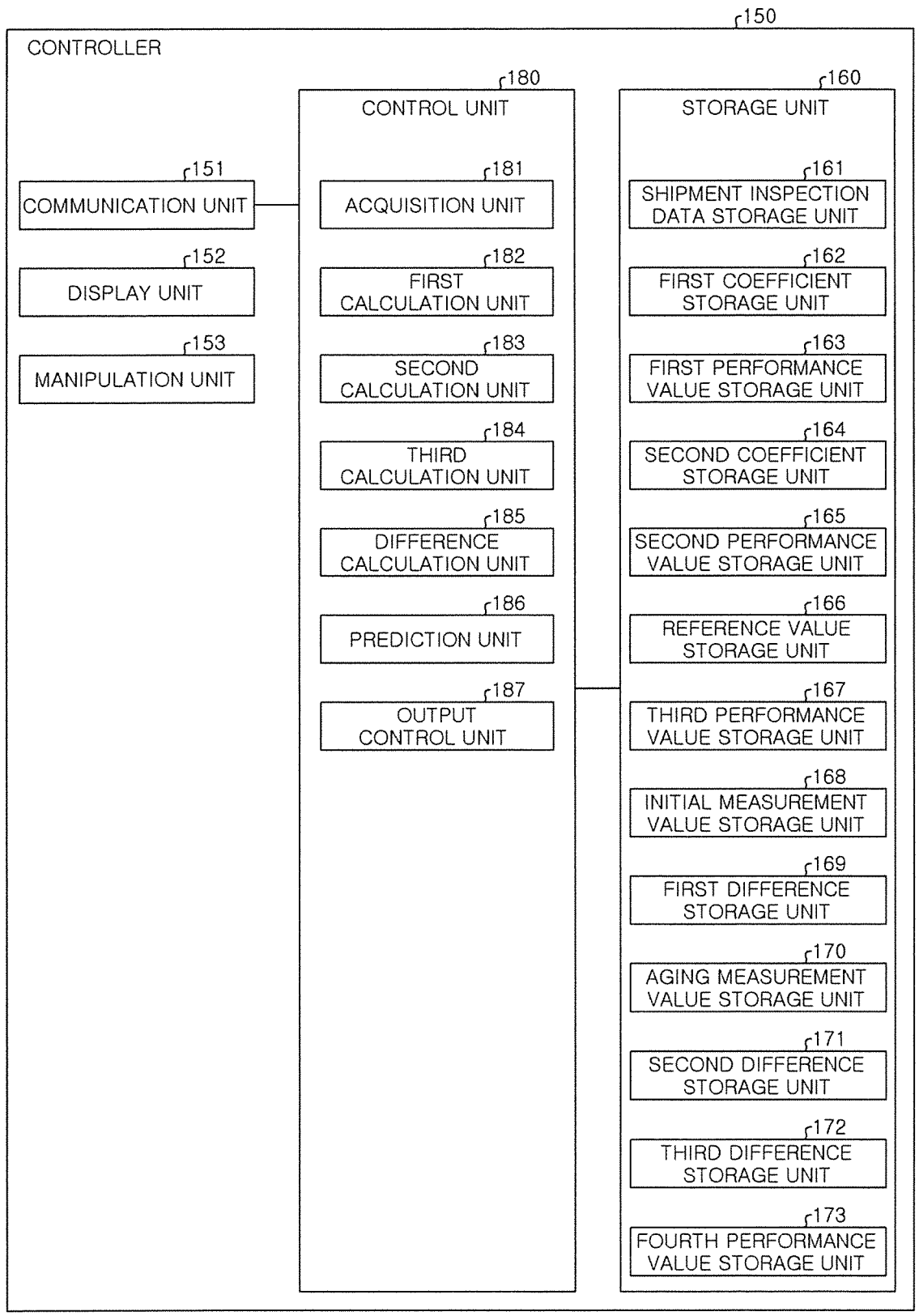
FIG. 3 is a block diagram showing an example of a controller according to the embodiment of the present disclosure.

Next, the configuration of the controller 150 will be described. FIG. 3 is a block diagram showing an example of the controller according to the embodiment of the present disclosure. As shown in FIG. 3, the controller 150 includes a communication unit 151, a display unit 152, a manipulation unit 153, a storage unit 160, and a control unit 180. Further, the controller 150 may have various functional units of a known computer, such as various input devices, various audio output devices, and the like, in addition to the functional units shown in FIG. 3.

The communication unit 151 is realized by, e.g., a network interface card (NIC) or the like. The communication unit 151 exchanges various information with end devices of the plasma processing apparatus 100. The communication unit 151 can use, e.g., EtherCAT (Registered Trademark) as a field bus system that communicates with the end devices of the plasma processing apparatus 100. EtherCAT is an industrial Ethernet (Registered Trademark) technology and performs communication in one frame for process data transmitted and received by all nodes in a network segment. Further, the communication unit 151 may be provided with an input/output (I/O) module and communicate with the end devices of the plasma processing apparatus 100 by inputting and outputting digital signals, analog signals, and serial signals using an I/O port of the I/O module.

The display unit 152 is a display device for displaying various information. The display unit 152 is realized by a display device such as a liquid crystal display or the like. The display unit 152 displays various screens such as a display screen inputted from the control unit 180, and the like.

The manipulation unit 153 is an input device for receiving various operations from an operator of the plasma processing apparatus 100. The manipulation unit 153 is realized by, e.g., an input device such as a keyboard, a mouse, or the like. The manipulation unit 153 outputs an operation inputted by the operator, as operation information, to the control unit 180. The manipulation unit 153 may be realized by the input device such as a touch panel or the like. The display device of the display unit 152 and the input device of the manipulation unit 153 may be provided as one device.

The storage unit 160 is realized by, e.g., random access memory (RAM), a semiconductor memory element such as flash memory, or a storage device such as a hard disk or an optical disk. The storage unit 160 includes a shipment inspection data storage unit 161, a first coefficient storage unit 162, a first performance value storage unit 163, a second coefficient storage unit 164, a second performance value storage unit 165, a reference value storage unit 166, a third performance value storage unit 167, and an initial measurement value storage unit 168. Further, the storage unit 160 includes a first difference storage unit 169, an aging measurement value storage unit 170, a second difference storage unit 171, a third difference storage unit 172, and a fourth performance value storage unit 173. In addition, the storage unit 160 stores information such as processing conditions (recipe) or the like used for the processing in the control unit 180.

The shipment inspection data storage unit 161 is configured to store, for each of the shipment inspection items of the flow rate controller, a deviation value in a range from the minimum value to the maximum value at the time of shipping. FIG. 4 shows an example of shipment inspection data of the flow rate controller in the present embodiment. "Adjustment/inspection items" shown in FIG. 4 indicate the shipment inspection items. For example, "Adjustment/inspection items" include a temperature difference, a pressure difference, a control valve adjustment, a zero point alarm, an external leakage check, an internal leakage check, and a flow rate correction/inspection. "Output values" indicate an inspection target value of each of the items. "Maximum/minimum values at the time of shipping" indicate the range from the minimum value to the maximum value of each of the items. "Shipment inspection item deviation values" indicate values of the respective items for each of the flow rate controllers. The shipment inspection data storage unit 161 stores, as the shipment inspection data, the items from "adjustment/inspection items" to "shipment inspection item deviation values" in association with each other.

The first coefficient storage unit 162 is configured to store a weighted matrix of the shipment inspection items of the flow rate controller. FIG. 5 shows examples of the performance items of the flow rate controller in the present embodiment. "Adjustment inspection items" shown in FIG. 5 indicate the shipment inspection items. The respective items of "adjustment/inspection items" correspond to letters "α" to "η" in the following matrix. "Output values" indicate an inspection target value of each of the items. "Individual performance items" indicate shipment inspection items (adjustment/inspection items) that affect the items indicating the performance of the flow controller (individual performance items). "Individual performance items" include "flow rate accuracy," "responsiveness," "controllability," "durability," and "aging." "Flow rate accuracy" is an item related to an absolute flow rate of the flow rate controller. "Responsiveness" is an item related to variation in the responsiveness of the flow rate controller. "Controllability" is an item related to the resistance of flow rate controller to external factors. "Durability" is an item related to the durability of the flow rate controller as hardware. "Aging" is an item related to the sensor of the flow rate controller. In "individual performance items" shown in FIG. 5, the shipment inspection items (adjustment/inspection items) that affect the individual unit performance items are marked by black circles. Further, the first coefficient storage unit 162 is configured to store "individual performance items" as an influence rate (contribution rate, domination rate) in the form of a percentage in a matrix. In other words, the first coefficient storage unit 162 stores α to η, indicating "adjustment/inspection items," as first coefficients that correspond to "individual performance items." The initial values of the first coefficients are inputted to the first coefficient storage unit 162 by the operator. Further, items that are not marked by black circles among "individual performance items" may have a value of, e.g., zero.

The first performance value storage unit 163 is configured to store first performance values expressed as a matrix indicating the performance of the individual flow rate controller. The first performance values are obtained by multiplying a matrix of the shipment inspection data and a matrix of the first coefficients. FIG. 6 shows an example of visualization of the performance of the flow rate controller in the present embodiment. As shown in FIG. 6, first performance values 303 are obtained by multiplying the matrix of the shipment inspection data 301 and the matrix of first coefficients 302. The shipment inspection data 301 are expressed as the matrix in which deviation values of the shipment inspection items are arranged in rows and the N-number of flow rate controllers are arranged in columns. The first coefficients 302 are expressed as the matrix in which the individual performance items are arranged in rows and the influence rates (α to η) of the adjustment/inspection items are arranged in columns. The first performance values 303 are expressed as the matrix in which the deviation values that visualize the performance of the flow rate controllers are arranged in rows and the N-number of flow rate controllers are arranged in columns. In other words, the first performance values 303 are expressed as a matrix indicating the performance of the flow rate controllers installed at the plasma processing apparatus 100 as the deviation values.

Figure 7:
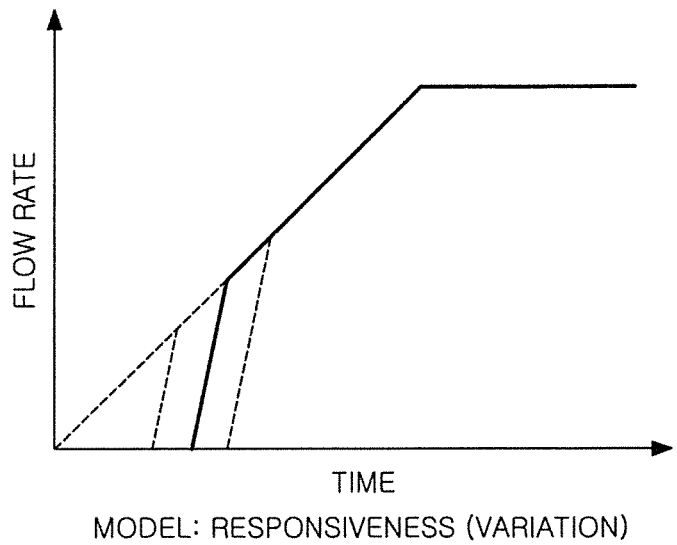
FIG. 7 shows an example of variation in responsiveness of the flow rate controller.

Here, the case of using the deviation values for visualizing the performance of the flow rate controller will be described with reference to FIGS. 7 and 8. FIG. 7 shows an example of variation in responsiveness of the flow rate controller. As shown in FIG. 7, the responsiveness of the flow rate controller varies when the flow rate increases to reach stability after the reception of a command to open the flow rate controller. The responsiveness is visualized by obtaining, for this variation, the deviation value of the standard deviation based on data of a plurality of shipped flow rate controllers of the plasma processing apparatus 100.

Figure 8:
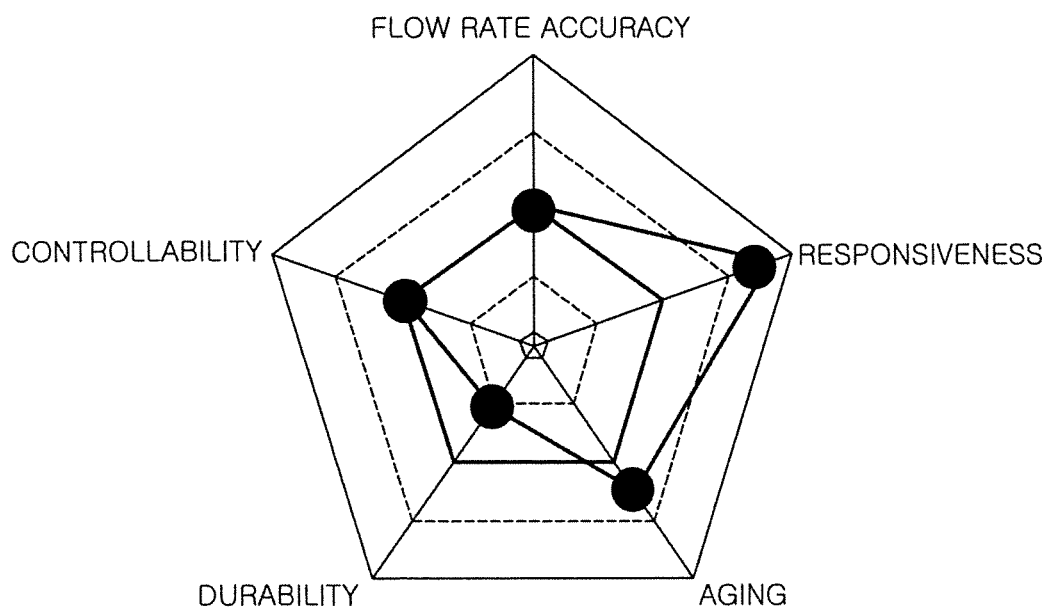
FIG. 8 shows an example of a radar chart showing the performance of the flow rate controller.

FIG. 8 shows an example of a radar chart showing the performance of the flow rate controller. As shown in FIG. 8, the performance of the flow rate controller can be shown by the radar chart by obtaining deviation values for other performance items. The respective performance items are weighted by a technical model while using, e.g., a control valve output as a main factor and an initial P1/P2 output and an internal leakage output value as an auxiliary factor for the increase in the responsiveness. In the example of FIG. 8, the flow rate accuracy and the controllability are equal to the standard level; the responsiveness and the aging are higher than the standard level; and the durability is lower than the standard level.

The second coefficient storage unit 164 is configured to store a matrix that the apparatus performance items of the plasma processing apparatus 100 are weighted. FIG. 9 shows examples of the performance items of the plasma processing apparatus in the present embodiment. "Apparatus performance items" shown in FIG. 9 indicate items monitored by the device. "Corresponding function" indicates whether to perform automatic correction or to notify an alarm when a value of an item is different from the central value. "Measurement method" indicates measurement targets and measurement methods of the items. "Item number" is used to identify the apparatus performance items in the case of expressing the apparatus performance items in the matrix. "Influence rate (individual performance items)" indicates a degree of influence of the items indicating the performance of the individual flow rate controller on the apparatus performance items. The letters "v to z" are used to identify the individual performance items of the influence rate in the case of expressing the apparatus performance items in the matrix. In "influence rate (individual performance items)" shown in FIG. 9, the items that affect the apparatus performance items are marked by black circles. For example, "flow rate accuracy" and "aging" affect "flow rate correction" among the apparatus performance items. Further, the second coefficient storage unit 164 is configured to store "influence rate (individual performance items)" as an influence rate (contribution rate, domination rate) in the form of a percentage in a matrix. In other words, the second coefficient storage unit 164 stores item numbers (1 to 6) representing "apparatus performance items" as second coefficients and "influence rates (individual performance items)" in association with "apparatus performance items." The initial values of the second coefficients are inputted to the second coefficient storage unit 164 by the operator.

The second performance value storage unit 165 is configured to store second performance values expressed as a matrix indicating the performance of the plasma processing apparatus 100. The second performance values are obtained by multiplying the matrix of the first performance values and a matrix of the second coefficients. FIG. 10 shows an example of visualization of the performance of the plasma processing apparatus in the present embodiment. As shown in FIG. 10, second performance values 305 are obtained by multiplying the matrix of the first performance values 303 and the matrix of second coefficients 304. The second coefficients 304 are expressed as the matrix in which the apparatus performance items of the plasma processing apparatus 100 are arranged in rows and the individual performance items (v to z) of the influence rate are arranged in columns. The second performance values 305 are expressed as the matrix in which deviation values that visualize the apparatus performance of the plasma processing apparatus 100 are arranged in rows and the N-number of flow rate controllers are arranged in columns. In other words, the second performance values 305 are expressed as the matrix indicating the performance of the plasma processing apparatus 100 as the deviation values.

Figure 11:
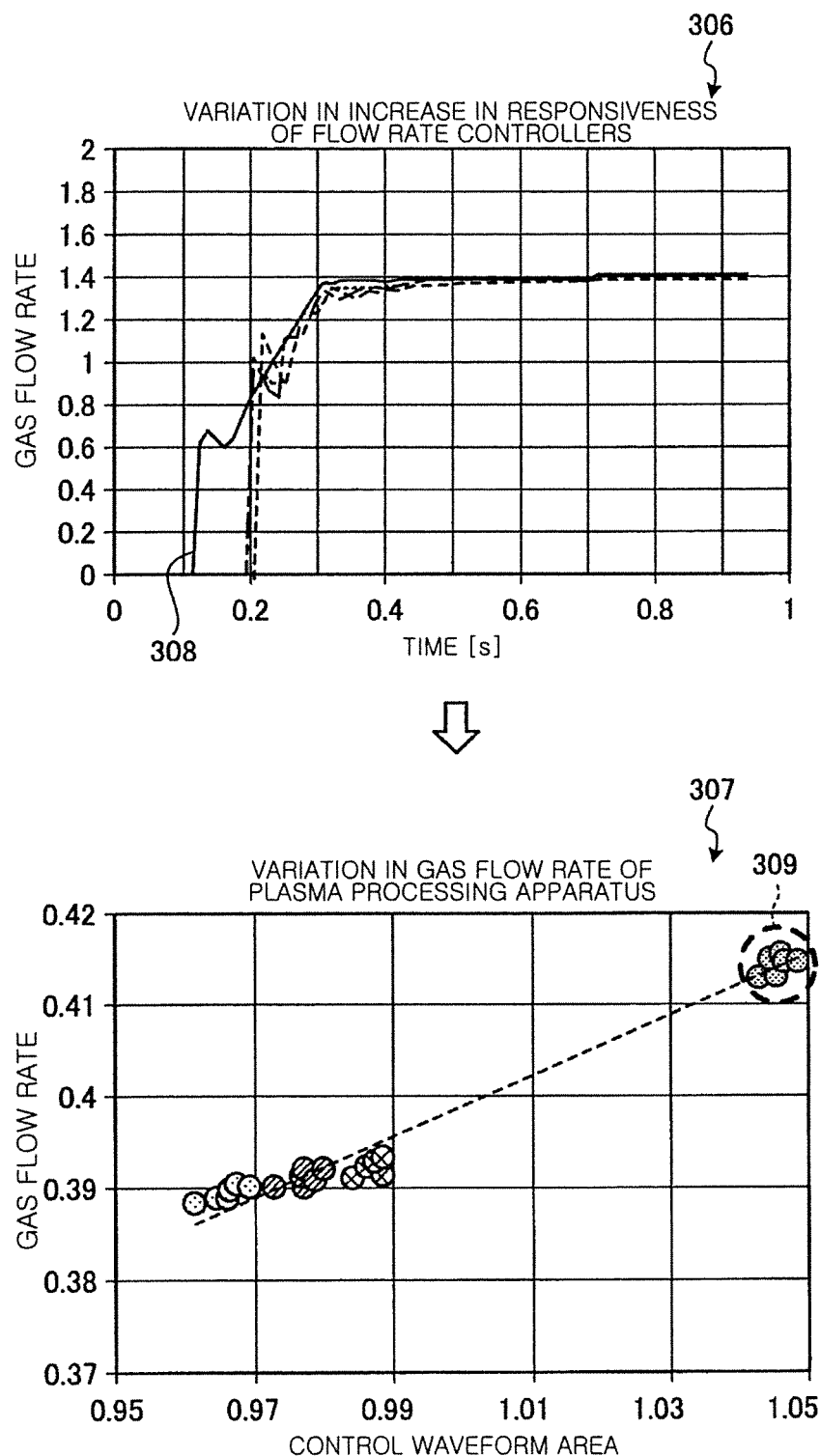
FIG. 11 shows an example of a relationship between an increase in responsiveness of flow rate controllers and variation in a gas flow rate of the plasma processing apparatus.

Here, the conversion of the performance of the flow rate controller to the performance of the plasma processing apparatus 100 will be described with reference to FIG. 11. FIG. 11 shows an example of the relationship between the increase in the responsiveness of the flow rate controllers and the variation in the gas flow rate of the plasma processing apparatus. A graph 306 in FIG. 11 shows variation in the increase in the responsiveness of the flow rate controllers. A graph 307 shows variation in the gas flow rate of the plasma processing apparatus 100. Referring to the graph 306, a graph 308 representing a certain flow rate controller increases earlier than the other graphs representing the other flow rate controllers. In the case of converting the performance of the flow rate controller to the performance of the plasma processing apparatus 100, the graph 307 is obtained by plotting the graph 307 based on the areas of the control waveforms of the flow rate controllers in the graph 306 and the gas flow rates. Referring to the graph 307, the flow rate controller indicated by the graph 308 is plotted in a region 309 distant from those of the other flow rate controllers. In other words, the variation in the flow rate controllers affects the variation in the performance of the plasma processing apparatus 100. The apparatus performance items give weights to the performances of the flow rate controllers of the apparatus. For example, in the case of confirming the responsiveness of the apparatus, information such as buildup in a stable state, control waveform area, buildup in a transient response period, a residual pressure for removing a residual gas, first out time, and a pressure in the processing chamber can be used for the weighting process.

The reference value storage unit 166 is configured to store reference values, i.e., the central values of the standard deviations of the apparatus performance items, obtained based on the performance data of a plurality of shipped (past) plasma processing apparatuses 100. The reference values are used for the conversion from the second performance values expressed as the deviation values indicating the performance of the plasma processing apparatus 100 to absolute values of the apparatus performance items.

Figure 12:
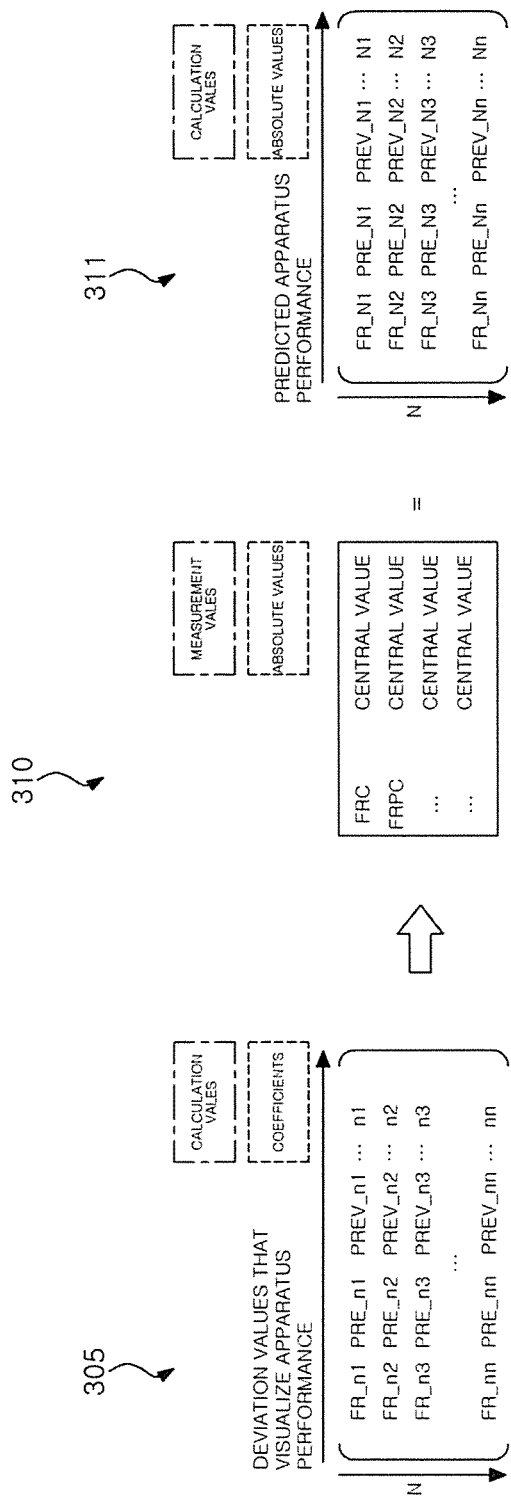
FIG. 12 shows an example of predicted performance of the plasma processing apparatus according to the embodiment.

The third performance value storage unit 167 is configured to store third performance values expressed as a matrix indicating predicted performance of the plasma processing apparatus 100. The third performance values are obtained by multiplying the matrix of the second performance values and a matrix of the reference values. FIG. 12 shows an example of the predicted performance of the plasma processing apparatus in the present embodiment. As shown in FIG. 12, third performance values 311 are obtained by applying the second performance values 305 to the reference values 310. The reference values 310 are expressed as the matrix in which the central values of the standard deviations of the apparatus performance items are respectively arranged in columns. The third performance values 311 are expressed as the matrix in which the predicted performance of the plasma processing apparatus 100 are arranged in rows and the N-number of flow rate controllers are arranged in columns. In other words, the third performance values 311 are expressed as the matrix indicating the performance of the plasma processing apparatus 100 as actual values (absolute values).

Referring back to FIG. 3, the initial measurement value storage unit 168 is configured to store initial measurement values expressed as a matrix indicating the initial apparatus performance at the time of shipping the plasma processing apparatus 100. The initial measurement values are expressed as the matrix indicating the performance of the plasma processing apparatus 100 as actual values (absolute values).

The first difference storage unit 169 is configured to store first differences expressed as a matrix indicating the differences between the initial measurement values and the third performance values indicating the predicted apparatus performance.

The aging measurement value storage unit 170 is configured to store aging measurement values expressed as a matrix indicating the performance of the plasma processing apparatus 100 after the elapse of a certain period of time. The aging measurement values are expressed as the matrix indicating the performance of the plasma processing apparatus 100 as actual values (absolute values).

The second difference storage unit 171 is configured to store second differences expressed as a matrix indicating the differences between the aging measurement values and first predicted values after the elapse of a certain period of time that are obtained based on the initial measurement values.

The third difference storage unit 172 is configured to store third differences that are predicted based on the second performance values and second predicted values after an additional elapse of a certain period of time that are obtained based on the aging measurement values. The third differences are expressed as a matrix indicating predicted differences between the second predicted values and fourth performance values, used for obtaining the fourth performance values expressed as a matrix indicating future apparatus performance.

The fourth performance value storage unit 173 is configured to store the fourth performance values expressed as the matrix indicating the future apparatus performance, which are predicted based on the second predicted values and the third differences. The fourth performance values are expressed as the matrix indicating the performance of the plasma processing apparatus 100 as actual values (absolute values).

The control unit 180 is realized by executing a program stored in an internal storage device while using a RAM as a work area by, e.g., a central processing unit (CPU), a micro processing unit (MPU), or the like. Further, the control unit 180 may be realized by, e.g., an integrated circuit such as an application specific integrated circuit (ASIC), a field programmable gate array (FPGA), or the like.

The control unit 180 includes an acquisition unit 181, a first calculation unit 182, a second calculation unit 183, a third calculation unit 184, a difference calculation unit 185, a prediction unit 186, and an output control unit 187. The control unit 180 implements or executes the operation or the function of information processing to be described below. The internal configuration of the control unit 180 is not limited to the configuration shown in FIG. 3, and may vary as long as the information processing to be described later can be performed.

The acquisition unit 181 is configured to acquire shipment inspection data of the respective flow rate controllers stored in a storage medium such as an SD memory card or the like using a medium reading device (not shown). The acquisition unit 181 stores the acquired shipment inspection data in the shipment inspection data storage unit 161. When the shipment inspection data is stored in the shipment inspection data storage unit 161, the acquisition unit 181 outputs a first calculation instruction to the first calculation unit 182.

Further, the acquisition unit 181 is configured to measure and acquire the initial measurement values of the apparatus performance items related to the flow rate controllers installed at the plasma processing apparatus 100. The acquisition unit 181 stores the acquired initial measurement values in the initial measurement value storage unit 168. Further, the acquisition unit 181 is further configured to acquire the aging measurement values of the apparatus performance items related to the flow rate controllers installed at the plasma processing apparatus 100 after the elapse of a certain period of time. The certain period of time may be, e.g., half a year or one year. Further, the acquisition unit 181 may newly measure and acquire aging measurement values whenever a certain period of time elapses. The acquisition unit 181 stores the acquired aging measurement values in the aging measurement value storage unit 170.

When the first calculation instruction is inputted from the acquisition unit 181, the first calculation unit 182 refers to the shipment inspection data storage unit 161 and the first coefficient storage unit 162 and calculates the first performance values based on the shipment inspection data and the first coefficients. In other words, the first calculation unit 182 is configured to calculate the performance values of the flow rate controllers. The first calculation unit 182 stores the calculated first performance values in the first performance value storage unit 163. When the first performance values are stored in the first performance value storage unit 163, the first calculation unit 182 outputs a second calculation instruction to the second calculation unit 183.

When the second calculation instruction is inputted from the first calculation unit 182, the second calculation unit 183 refers to the first performance value storage unit 163 and the second coefficient storage unit 164 and calculates the second performance values based on the first performance values and the second coefficients. In other words, the second calculation unit 183 is configured to calculate the performance values of the plasma processing apparatus 100. The second calculation unit 183 stores the calculated second performance values in the second performance value storage unit 165. When the second performance values are stored in the second performance value storage unit 165, the second calculation unit 183 outputs a third calculation instruction to the third calculation unit 184.

When the third calculation instruction is inputted from the second calculation unit 183, the third calculation unit 184 refers to the second performance value storage unit 165 and the reference value storage unit 166 and determines the third performance values based on the second performance values and the reference values. In other words, the third calculator 184 is configured to calculate the predicted performance values of the plasma processing apparatus 100. The third calculation unit 184 stores the calculated third performance values in the third performance value storage unit 167. When the third performance values are stored in the third performance value storage unit 167, the third calculation unit 184 outputs a difference calculation instruction to the difference calculation unit 185.

When the difference calculation instruction is inputted from the third calculation unit 184, the difference calculation unit 185 refers to the third performance value storage unit 167 and the initial measurement value storage unit 168 and determines the differences between the third performance values and the initial measurement values. The difference calculation unit 185 determines whether or not there are differences between the third performance values and the initial measurement values, i.e., whether or not the third performance values are equal to the initial measurement values. When it is determined that the third performance values are not equal to the initial measurement values, the difference calculation unit 185 stores the calculated differences, as the first differences, in the first difference storage unit 169. Further, the difference calculation unit 185 corrects the first coefficients of the first coefficient storage unit 162 and the second coefficients of the second coefficient storage unit 164 by applying (reflecting) the first differences to the first coefficients and the second coefficients and updates the first coefficient storage unit 162 and the second coefficient storage unit 164. In other words, the difference calculation unit 185 is configured to perform a feedback process of the first coefficients and the second coefficients.

On the other hand, when it is determined that the third performance values are equal to the initial measurement values, the difference calculation unit 185 generates a function of the change due to aging. First, in order to obtain the function of the change due to aging, the function of change is first generated for each of the individual performance items such as the flow rate accuracy, the responsiveness, the controllability, the durability, and the aging. For example, in the case of the function of change for the flow rate accuracy, a function of "flow rate accuracy=aT+b" is generated, where T indicates an elapsed period of time. Next, the function of the change due to aging is obtained by multiplying the function of change for each of the individual performance items by the influence rates. If the influence rates of the flow rate accuracy, the responsiveness, the controllability, the durability, and the aging are respectively expressed by letters v to z, the function of the change due to aging of "flow rate correction" corresponding to item No. "1" of the apparatus performance items can be expressed by the following equation (1):

$$\text{Flow rate correction} = v1*\text{flow rate accuracy} + w1*\text{responsiveness} + x1*\text{controllability} + y1*\text{durability} + z1*\text{aging} \qquad \text{Eq. (1).}$$

The difference calculation unit 185 outputs the generated function of the change due to aging to the prediction unit 186.

The prediction unit 186 is configured to calculate first predicted values after the elapse of a certain period of time (T=k) from the initial measurement values based on the function of the change due to aging inputted from the difference calculation unit 185. The prediction unit 186 calculates the differences between the calculated first predicted values and the aging measurement values obtained after the elapse of the certain period of time (T=k). The prediction unit 186 determines whether or not there are differences between the first predicted values and the aging measurement values, i.e., whether or not the first predicted values are equal to the aging measurement values. When it is determined that the first predicted values are not equal to the aging measurement values, the prediction unit 186 stores the calculated differences, as the second differences, in the second difference storage unit 171. Further, the prediction unit 186 corrects the first coefficients in the first coefficient storage unit 162 and the second coefficients in the second coefficient storage unit 164 by reflecting the second differences to the first coefficients and the second coefficients, and updates the first coefficient storage unit 162 and the second coefficient storage unit 164. In other words, the prediction unit 186 performs a feedback process of the first coefficients and the second coefficients after the elapse of the certain period of time. Then, the prediction unit 186 proceeds to a process of calculating the second predicted values after an additional elapse of a certain period of time (T=k+1).

On the other hand, when it is determined that the first predicted values are equal to the aging measurement values, the prediction unit 186 calculates the second predicted values after the additional elapse of the certain period of time (T=k+1). The prediction unit 186 refers to the second performance value storage unit 165 and predicts the third differences between the calculated second predicted values and the fourth performance values calculated after the additional elapse of the certain period of time (T=k+1) based on the second performance values. In other words, the prediction unit 186 predicts the third differences for correcting the second predicted values to the fourth performance values based on the second predicted values and the second performance values. The prediction unit 186 stores the predicted third differences in the third difference storage unit 172. In addition, the prediction unit 186 predicts the fourth performance values based on the second predicted values and the third differences. The prediction unit 186 stores the predicted fourth performance values in the fourth performance value storage unit 173. Although the case where the prediction unit 186 predicts the third differences and the fourth performance values after the additional elapse of the certain period of time (T=k+1) has been described, the prediction unit 186 may actually apply, after the additional elapse of the certain period of time (T=k+1), a feedback process for updating the first coefficient storage unit 162 and the second coefficient storage unit 164 by performing the same process as that performed after the elapse of the certain period of time (T=k).

Further, the prediction unit 186 may repeatedly execute the process for "after the elapse of a certain period of time (T=k)" even after the additional elapse of a certain period of time (T=k+1) until the time at which the aging measurement values become lower than or equal to the thresholds of the apparatus performance items, and may correct the flow rate controllers or notify an alarm when the values of the apparatus performance items approach close to the thresholds of the apparatus performance items. The thresholds may be, e.g., 50% of the initial measurement values.

Figure 13:
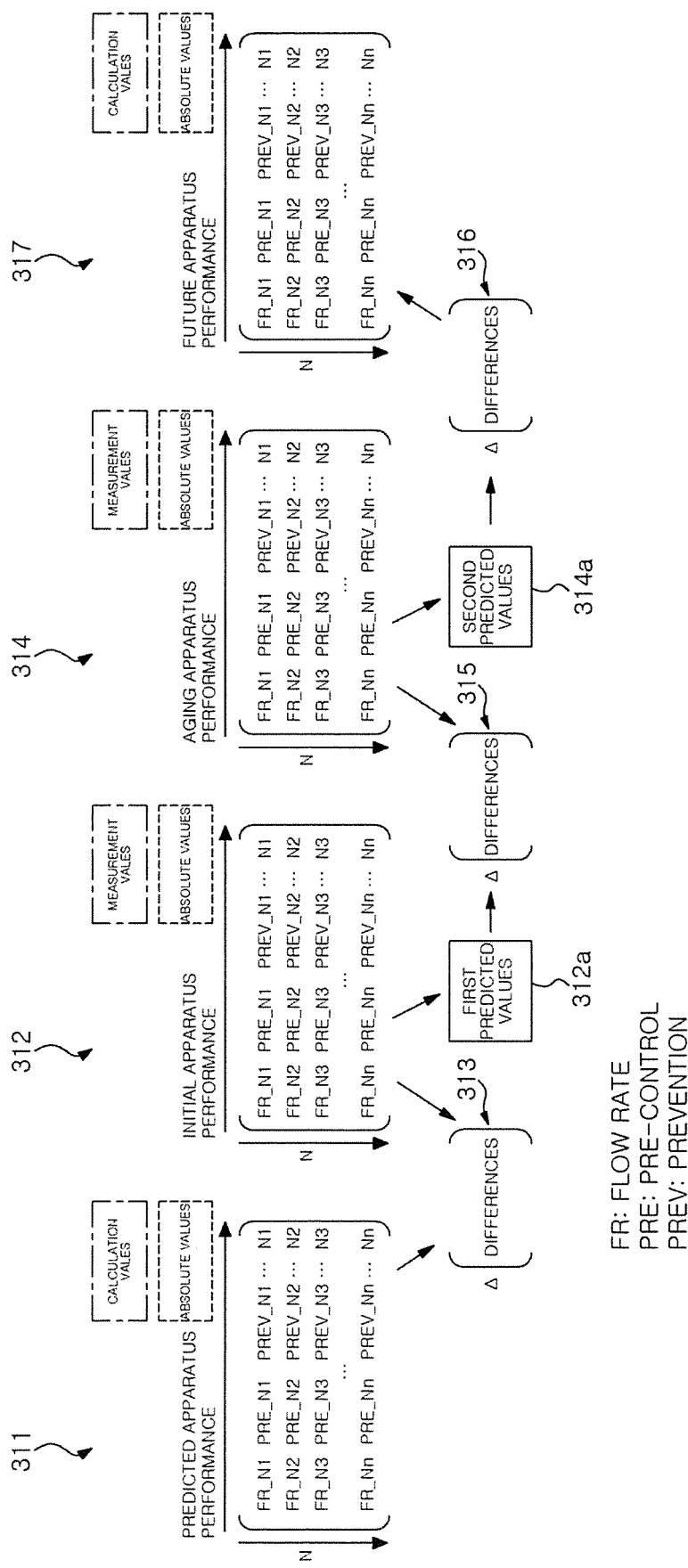
FIG. 13 shows an example of a feedback process according to the embodiment.

Here, the feedback process will be described with reference to FIG. 13. FIG. 13 shows an example of the feedback process in the present embodiment. As shown in FIG. 13, the difference calculation unit 185 calculates first differences 313 between the third performance values 311 and initial measurement values 312. The difference calculation unit 185 performs the feedback process for the first coefficients 302 and the second coefficients 304 using the first differences 313 (see FIGS. 6 and 10). Further, the prediction unit 186 calculates first predicted values 312$a$ after the elapse of the certain period of time (T=k) from the initial measurement values 312 based on the function of the change due to aging. The prediction unit 186 calculates second differences 315 between the first predicted values 312$a$ and aging measurement values 314 obtained after the elapse of a certain period of time (T=k). The prediction unit 186 performs the feedback process for the first coefficients 302 and the second coefficients 304 using the second differences 315.

Further, the prediction unit 186 calculates second predicted values 314$a$ after the additional elapse of a certain period of time (T=k+1). The prediction unit 186 predicts third differences 316 for correcting the second predicted values 314$a$ to fourth performance values 317 based on the second predicted values 314$a$ and the second performance values 305 (see FIG. 10). The prediction unit 186 predicts the fourth performance values 317 based on the second predicted values 314$a$ and the third differences 316. In other words, in the example of FIG. 13, the future performance of the plasma processing apparatus 100 can be predicted.

Referring back to FIG. 3, the output control unit 187 refers to the first performance value storage unit 163, the second performance value storage unit 165, the third performance value storage unit 167, and the fourth performance value storage unit 173 and displays the first performance values to the fourth performance values on the display unit 152 in response to an operator's instruction.

<Performance Calculation Method (Feedback Process)>

Figure 14:
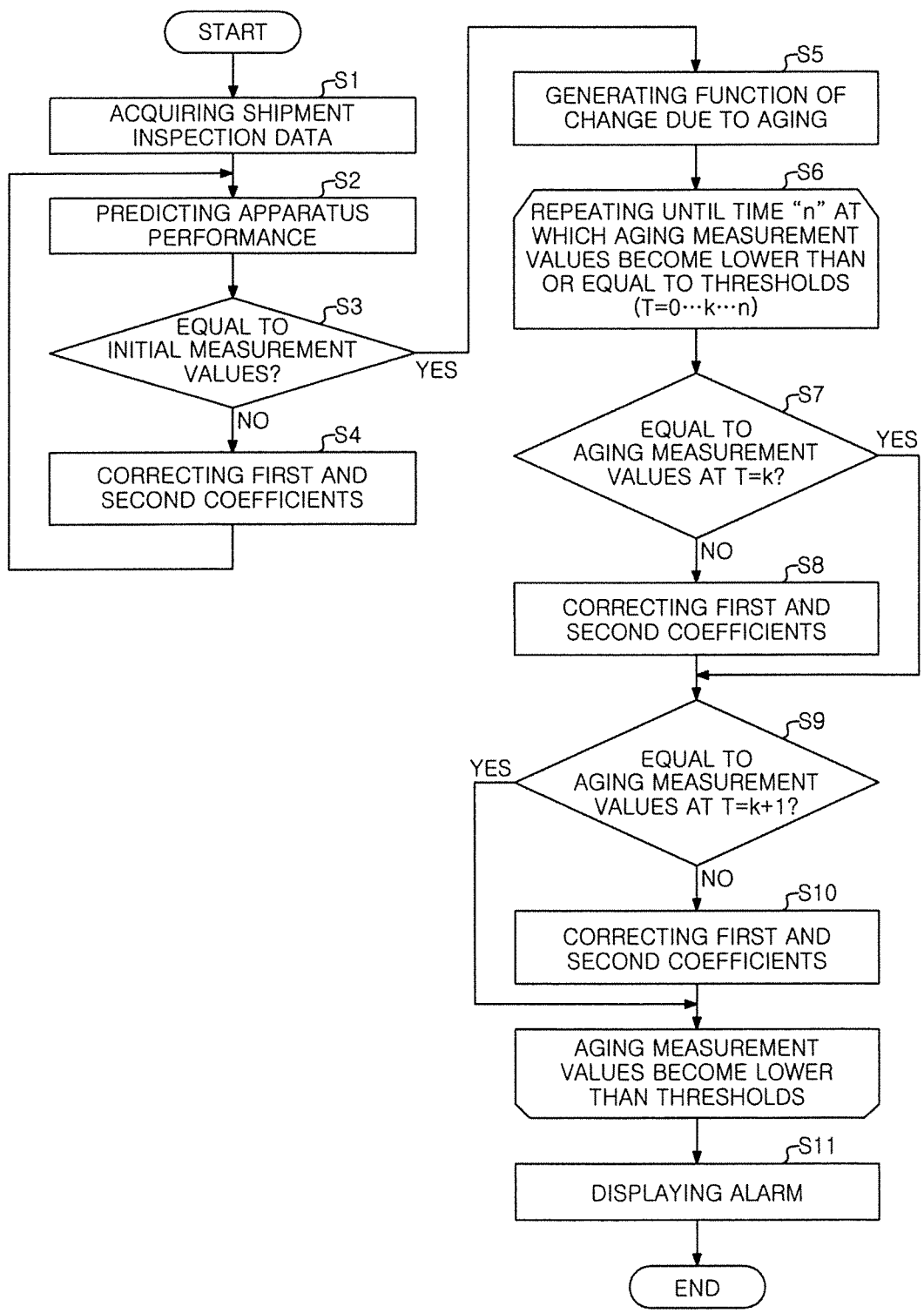
FIG. 14 is a flowchart showing an example of the feedback process according to the embodiment.

Next, the operation of the controller 150 in the plasma processing apparatus 100 of the present embodiment will be described. FIG. 14 is a flowchart showing an example of the feedback process in the present embodiment. FIG. 14 explains the feedback process of measuring the change due to aging and outputting an alarm when the values of the apparatus performance items become lower than or equal to the thresholds of the apparatus performance items.

The acquisition unit 181 of the controller 150 acquires the shipment inspection data of the respective flow rate controllers (step S1). The acquisition unit 181 stores the acquired shipment inspection data in the shipment inspection data storage unit 161 and outputs the first calculation instruction to the first calculation unit 182. Further, the acquisition unit 181 measures the initial measurement values of the apparatus performance items and stores the initial measurement values in the initial measurement value storage unit 168.

When the first calculation instruction is inputted from the acquisition unit 181, the first calculation unit 182 refers to the shipment inspection data storage unit 161 and the first coefficient storage unit 162 and calculates the first performance values that are the performance values of the flow rate controllers based on the shipment inspection data and the first coefficient. The first calculation unit 182 stores the calculated first performance values in the first performance value storage unit 163 and outputs a second calculation instruction to the second calculation unit 183.

When the second calculation instruction is inputted from the first calculation unit 182, the second calculation unit 183 refers to the first performance value storage unit 163 and the second coefficient storage unit 164 and calculates the second performance values indicating the performance values of the plasma processing apparatus 100 based on the first performance values and the second coefficients. The second calculation unit 183 stores the calculated second performance values in the second performance value storage unit 165 and outputs a third calculation instruction to the third calculation unit 184.

When the third calculation instruction is inputted from the second calculation unit 183, the third calculation unit 184 refers to the second performance value storage unit 165 and the reference value storage unit 166 and determines the third performance values indicating the predicted performance values of the plasma processing apparatus 100 based on the second performance values and the reference values (step S2). The third calculation unit 184 stores the calculated third performance values in the third performance value storage unit 167 and outputs a difference calculation instruction to the difference calculation unit 185.

When the difference calculation instruction is inputted from the third calculation unit 184, the difference calculation unit 185 refers to the third performance value storage unit 167 and the initial measurement value storage unit 168 and calculates the first differences between the third performance values and the initial measurement values. The difference calculation unit 185 determines whether or not the third performance values are equal to the initial measurement values (step S3). When it is determined that the third performance values are not equal to the initial measurement values (NO in step S3), the difference calculation unit 185 corrects the first coefficients and the second coefficients based on the first differences (step S4), and the processing returns to step S2.

On the other hand, when it is determined that the third performance values are equal to the initial measurement value (YES in step S3), the difference calculation unit 185 generates the function of the change due to aging of the performance (step S5). The difference calculation unit 185 outputs the generated function of the change due to aging to the prediction unit 186.

The prediction unit 186 calculates the first predicted values after the elapse of a certain period (T=k) from the initial measurement values based on the function of the change due to aging inputted from the difference calculation unit 185. Further, the acquisition unit 181 acquires the aging measurement values of the apparatus performance items after the elapse of the certain period of time and stores the aging measurement values in the aging measurement value storage unit 170. Then, the prediction unit 186 repeats the processing of the following steps S7 to S10 until the time at which the aging measurement values become lower than or equal to the thresholds (T=n) (step S6).

The prediction unit 186 calculates the second differences between the calculated first predicted values and the aging measurement values obtained after the elapse of the certain period of time (T=k). The prediction unit 186 determines whether or not the first predicted values are equal to the aging measurement values based on the calculated second differences (step S7). When it is determined that the first predicted values are not equal to the aging measurement values (NO in step S7), the prediction unit 186 corrects the first coefficients and the second coefficients based on the second difference (step S8) and calculates the second predicted values after the additional elapse of a certain period of time (T=k+1). Then, the processing proceeds to step S9.

On the other hand, when it is determined that the first predicted values are equal to the aging measurement values (YES in step S7), the prediction unit 186 calculates the second predicted values after the additional elapse of the certain period of time (T=k+1). The prediction unit 186 calculates fourth differences between the second predicted values and the aging measurement values after the additional elapse of the certain period of time (T=k+1). The prediction unit 186 determines whether or not the second predicted values are equal to the aging measurement values based on the calculated fourth differences (step S9). When it is determined that the second predicted values are not equal to the aging measurement values (NO in step S9), the prediction unit 186 corrects the first coefficients and the second coefficients based on the fourth difference (step S10). Then, the processing returns to step S6. When it is determined that the second predicted values are equal to the aging measurement values (YES in step S9), the prediction unit 186 does not correct the first coefficients and the second coefficients, and the processing returns to step S6.

The prediction unit 186 repeats the processing of steps S7 to S10 until the time at which the aging measurement values become lower than or equal to the thresholds (T=n). When the aging measurement values become lower than or equal to the thresholds, an alarm is displayed on the display unit 152 and notified to the operator (step S11). In this manner, the controller 150 of the plasma processing apparatus 100 can calculate the performance values of the plasma processing apparatus 100 related to the flow rate controllers and output an alarm in response to the calculated performance values. Further, for the automatically correctable apparatus performance items, the automatic correction of the flow rate controllers may be performed instead of outputting an alarm.

<Modification>

Figure 15:
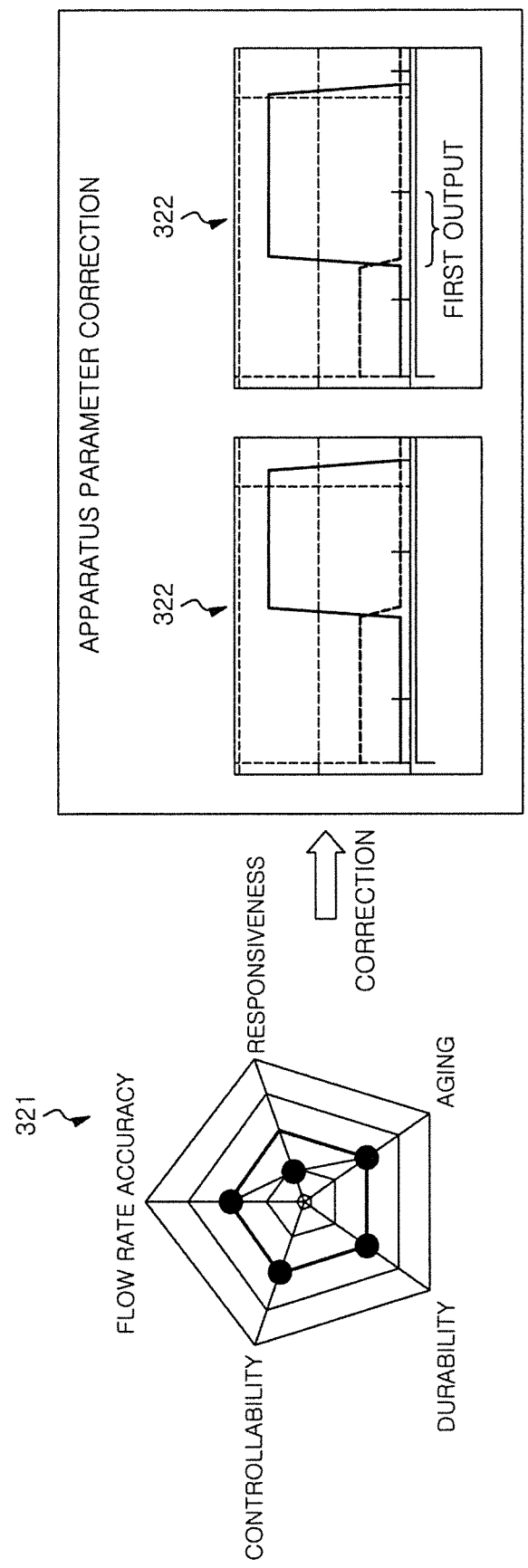
FIG. 15 shows an example of parameter correction based on initial performance of the flow rate controller.

Although the change due to aging of the apparatus performance items are predicted using the function of the change due to aging of the performance in the above embodiments, the parameters at the time of installing the flow rate controllers at the plasma processing apparatus 100 may be corrected based on the individual performance items of the flow rate controllers. FIG. 15 shows an example of parameter correction based on the initial performance of the flow rate controller. When there is a flow rate controller (e.g., low-priced product) having low responsiveness at the initial performance as shown in a chart 321 of FIG. 15, the parameters of the apparatus are corrected in response to the low responsiveness. For example, relating to graph 322 showing the control of a reference product whose responsiveness is close to the central value of the standard deviation, the flow rate controller that is the low-priced product having low responsiveness is output first by conducting parameter correction as shown in a graph 323. By correcting the parameters, it is possible to use a low-price flow rate controller at a location (e.g., $N_2$ gas line) that is not a critical gas line where fine control is required.

As described above, in accordance with the present embodiment, the plasma processing apparatus 100 acquires the shipment inspection data of multiple flow rate controllers. Further, the plasma processing apparatus 100 calculates the first performance values indicating, as deviation values, the performance of the flow rate controllers based on the acquired shipment inspection data and the first coefficients for the items indicating the performance of the flow rate controllers. Further, the plasma processing apparatus 100 calculates the second performance values indicating, as deviation values, the performance of the plasma processing apparatus 100 based on the calculated first performance values and the second coefficients for the items indicating the performance of the plasma processing apparatus 100 using the flow rate controllers. Accordingly, it is possible to calculate the performance of the plasma processing apparatus 100 related to the flow rate controllers.

Further, in accordance with the present embodiment, the plasma processing apparatus 100 calculates the third performance values indicating the predicted performance of the plasma processing apparatus 100 based on the calculated second performance values and the past reference values related to the performance of the plasma processing apparatus 100. Accordingly, it is possible to calculate the performance of the plasma processing apparatus 100 related to the flow rate controllers that has reflected the past reference values.

Further, in accordance with the present embodiment, the plasma processing apparatus 100 acquires the initial measurement values of the performance of the plasma processing apparatus 100. Further, the plasma processing apparatus 100 calculates the first differences between the third performance values and the acquired initial measurement values. The plasma processing apparatus 100 reflects the calculated first differences to the first coefficients and the second coefficients. Accordingly, it is possible to improve the prediction accuracy by performing the feedback of the difference between the predicted third performance values and the initial measurement values.

Further, in accordance with the present embodiment, the plasma processing apparatus 100 obtains the measurement values of the performance of the plasma processing apparatus 100 after a certain period of time has elapsed. Further, the plasma processing apparatus 100 calculates the second differences between the first predicted values after an elapse of a certain period that are calculated based on the initial measurement values and the measurement values obtained after the elapse of the certain period. Accordingly, it is possible to improve the prediction accuracy by performing the feedback of the second differences between the measurement values and the first predicted values after the elapse of the certain period.

Further, in accordance with the present embodiment, the plasma processing apparatus 100 predicts the second predicted values after an additional elapse of a certain period that are obtained based on the measurement values obtained after the elapse of the certain period, and predicts the third differences based on the second predicted values and the second performance values. Further, the plasma processing apparatus 100 predicts the fourth performance values based on the second predicted values and the third differences.

Accordingly, it is possible to predict the future performance of the plasma processing apparatus 100.

Further, in accordance with the present embodiment, the shipment inspection data includes one or more items among a temperature difference, a pressure difference, a control valve adjustment, a zero point alarm, an external leakage check, an internal leakage check, and a flow rate correction/inspection. Accordingly, it is possible to calculate the performance of the plasma processing apparatus 100 related to the flow rate controllers.

Further, in accordance with the present embodiment, the items indicating the performance of each of the flow rate controllers are one or more items including flow rate accuracy, responsiveness, controllability, durability, and aging. Accordingly, it is possible to reflect the performance of the flow rate controllers to the performance of the plasma processing apparatus 100.

Further, in accordance with the present embodiment, the plasma processing apparatus 100 calculates a period of time elapsed until values of the items indicating the performance of the flow rate controllers become lower than or equal to the thresholds based on the function of the change due to aging of the performance using the items indicating the performance of the flow rate controllers. Therefore, it is possible to determine the maintenance timing of the flow rate controllers. Accordingly, a wafer loss in a manufacturing line can be suppressed.

Further, in accordance with the present embodiment, the plasma processing apparatus 100 notifies the end of the period of time by an alarm. Accordingly, it is possible to notify the maintenance timing of the flow rate controllers.

Further, in accordance with the present embodiment, the plasma processing apparatus 100 corrects the flow rate controllers at the end of the period of time. Accordingly, it is possible to continue the processing in the plasma processing apparatus 100.

The presently disclosed embodiments are considered in all respects to be illustrative and are not restrictive. The above-described embodiments can be embodied in various forms. Further, the above-described embodiments may be omitted, replaced, or changed in various forms without departing from the scope of the appended claims and the gist thereof.

In the performance calculation method of the above-described embodiment, the feedback process of measuring the change due to aging and outputting an alarm when the values of the apparatus performance items become lower than or equal to the thresholds of the apparatus performance items has been described. However, the present disclosure is not limited thereto. For example, by employing the performance calculation method for outputting the third performance values indicating the predicted performance at the time of manufacturing the plasma processing apparatus 100, the third performance values may be used for the shipment inspection of the plasma processing apparatus 100.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing apparatus comprising:
a controller including circuitry configured to:
(a) acquire shipment inspection data of the multiple flow rate controllers;
(b) calculate first performance values indicating, as deviation values, performance of the multiple flow rate controllers based on acquired shipment inspection data and first coefficients for items indicating the performance the multiple flow rate controllers;
(c) calculate second performance values indicating, as deviation values, performance of the plasma processing apparatus based on the calculated first performance values and second coefficients for items indicating the performance of the plasma processing apparatus; and
(d) using feedback from the calculating in (b) and the calculating in (c) to automatically adjust an operation of the flow rate controllers so the first performance values and the second performance values remain above predetermined performance thresholds during operation of the processing apparatus;
wherein the circuitry comprises a programmable processor and a memory that has computer readable instructions stored therein, execution of the computer readable instructions by the programmable processor configures the programmable processor to perform steps (a), (b), and (c).

2. The plasma processing apparatus of claim 1, wherein the circuitry is configured to calculate third performance values indicating predicted performance of the processing apparatus based on the calculated second performance values and past reference values related to the performance of the processing apparatus.

3. The plasma processing apparatus of claim 2, wherein the circuitry is configured to acquire initial measurement values of the performance of the processing apparatus, and wherein the processing apparatus further comprises:
circuitry configured to calculate first difference between the third performance values and the acquired initial measurement values and to apply the calculated first differences to the first coefficients and the second coefficients.

4. The plasma processing apparatus of claim 3, wherein the circuitry is configured to acquire measurement values of the performance of the processing apparatus after an elapse of a certain period, and
the processing apparatus further comprises:
a circuitry configured to calculate second differences between first predicted values after the elapse of the certain period that are obtained based on the initial measurement values and the measurement values obtained after the elapse of the certain period.

5. The plasma processing apparatus of claim 4, wherein the circuitry is configured to:
predict second predicted values after an additional elapse of a certain period that are obtained based on the measurement values obtained after the elapse of the certain period; predict third differences between the second predicted values and the second performance values; and
predict fourth performance values based on the second predicted values and the third differences.

6. The plasma processing apparatus of claim 1, wherein the shipment inspection data includes one or more items including a temperature difference, a pressure difference, a control valve adjustment, a zero point alarm, an external leakage check, an internal leakage check, and a flow rate correction/inspection.

7. The plasma processing apparatus of claim 1, wherein the items indicating the performance of the flow rate controllers are one or more items including flow rate accuracy, responsiveness, controllability, durability, and aging.

8. The plasma processing apparatus of claim 5, wherein the circuitry is further configured to calculate a period of time elapsed until the values of the items indicating the performance of the flow rate controllers become lower than or equal to thresholds based on a function of change due to aging of the performance using the items indicating the performance of the flow rate controllers.

9. The plasma processing apparatus of claim 8, wherein the circuitry is further configured to notify an end of the period of time by an alarm.

10. The plasma processing apparatus of claim 8, wherein the circuitry is further configured to correct the flow rate controllers at the end of the period of time.

11. The plasma processing apparatus of claim 1, wherein the circuitry comprises a programmable processor and a memory that has computer readable instructions stored therein, execution of the computer readable instructions by the programmable processor configured to the programmable processor to perform (a), (b), and (c).

12. The plasma processing apparatus of claim 1, wherein the circuitry comprises at least one of an application specific integrated circuit (ASIC) and a field programmable gate array (FPGA).

13. A method for calculating performance comprising:
operating a controller including circuitry configured to perform the steps of:
  (a) acquiring shipment inspection data of multiple flow rate controllers;
  (b) calculating first performance values indicating, as deviation values, performance of the flow rate controllers based on the acquired shipment inspection data and first coefficients for items indicating the performance of the flow rate controllers;
  (c) calculating second performance values indicating, as deviation values, performance of a processing apparatus using the flow rate controllers based on the calculated first performance values and second coefficients for items indicating the performance of the processing apparatus; and
  (d) using feedback from the calculating in (b) and the calculating in (c) to automatically adjust an operation of the flow rate controllers so the first performance values and the second performance values remain above predetermined performance thresholds during operation of the processing apparatus;
wherein the circuitry comprises a programmable processor and a memory that has computer readable instructions stored therein, execution of the computer readable instructions by the programmable processor configures the programmable processor to perform steps (a), (b), and (c).

14. A method for calculating performance comprising:
operating a controller including circuitry configured to perform the steps of:
  (a) acquiring shipment inspection data of multiple flow rate controllers;
  (b) calculating first performance values indicating, as deviation values, performance of the flow rate controllers based on the acquired shipment inspection data and first coefficients for items indicating the performance of the flow rate controllers; and
  (c) calculating second performance values indicating, as deviation values, performance of a processing apparatus using the flow rate controllers based on the calculated first performance values and second coefficients for items indicating the performance of the processing apparatus; and
  (d) using feedback from the calculating in (b) and the calculating in (c) to automatically adjust an operation of the flow rate controllers so the first performance values and the second performance values remain above predetermined performance thresholds during operation of the processing apparatus;
wherein the circuitry comprises at least one of an application specific integrated circuit (ASIC) and a field programmable gate array (FPGA).

* * * * *